(12) United States Patent
Tsai et al.

(10) Patent No.: US 8,425,245 B2
(45) Date of Patent: Apr. 23, 2013

(54) FASTENER FOR AN ELECTRICAL CONNECTOR

(75) Inventors: Shang Ju Tsai, Keelung (TW); Yan Xian Yuan, Guangzhou (CN); Yao Li, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 122 days.

(21) Appl. No.: 13/183,817

(22) Filed: Jul. 15, 2011

(65) Prior Publication Data

US 2012/0267498 A1 Oct. 25, 2012

(30) Foreign Application Priority Data

Apr. 22, 2011 (CN) ...................... 2011 2 0122663 U

(51) Int. Cl.
*H01R 13/62* (2006.01)
(52) U.S. Cl.
USPC ........................... 439/331; 248/447; 248/371
(58) Field of Classification Search .................. 439/331, 439/71, 342; 248/447, 454, 455, 456, 458, 248/460, 175, 461, 462, 463, 465; 281/33, 281/45; 108/6, 9, 11, 14; 220/379, 744; 206/45, 23, 454, 452
See application file for complete search history.

(56) References Cited

U.S. PATENT DOCUMENTS

| | | | | |
|---|---|---|---|---|
| 6,334,786 B1 * | 1/2002 | Lee | ............................... | 439/331 |
| 6,626,683 B2 * | 9/2003 | Lai | ................................... | 439/73 |
| 6,746,253 B1 * | 6/2004 | Ma | ................................... | 439/71 |
| 6,927,981 B1 * | 8/2005 | Kao | ............................... | 361/740 |
| 7,179,109 B1 * | 2/2007 | Ma | .................................. | 439/331 |
| 7,210,952 B2 * | 5/2007 | Ishida | ........................... | 439/331 |
| 7,247,043 B2 * | 7/2007 | Lai | ................................. | 439/331 |
| 7,402,065 B1 * | 7/2008 | Polnyi | ........................... | 439/331 |
| 7,435,124 B2 * | 10/2008 | Ma et al. | ....................... | 439/331 |
| 7,473,121 B2 * | 1/2009 | Fan et al. | ...................... | 439/342 |
| 7,517,229 B2 * | 4/2009 | Ma | .................................. | 439/73 |
| 7,556,522 B2 * | 7/2009 | Ma | .................................. | 439/342 |
| 7,588,442 B2 * | 9/2009 | Ma | .................................. | 439/73 |
| 7,588,452 B2 * | 9/2009 | Yeh | ................................. | 439/331 |
| 7,628,634 B2 * | 12/2009 | Yeh et al. | ...................... | 439/331 |
| 7,641,482 B2 * | 1/2010 | Zhong | ............................ | 439/71 |
| 7,651,357 B2 * | 1/2010 | Szu | ................................. | 439/331 |
| 7,841,884 B2 * | 11/2010 | Ma | .................................. | 439/331 |
| 7,867,004 B2 * | 1/2011 | Ma | .................................. | 439/331 |
| 7,867,006 B2 * | 1/2011 | Yeh | ................................. | 439/331 |
| 7,896,677 B2 * | 3/2011 | Fan | ................................. | 439/331 |
| 7,927,121 B2 * | 4/2011 | Ma et al. | ....................... | 439/331 |
| 7,993,153 B2 * | 8/2011 | Hsu et al. | ...................... | 439/331 |
| 8,038,114 B2 * | 10/2011 | Ting | ......................... | 248/346.01 |

(Continued)

*Primary Examiner* — Nkeisha Smith
(74) *Attorney, Agent, or Firm* — Morris Manning & Martin LLP; Tim Tingkang Xia, Esq.

(57) ABSTRACT

The invention relates to a fastener. The fastener includes: a lower fastening base, in which a pivoting plate is disposed upward on a back end of the lower fastening base and concavely disposed with a limiting groove, an upper fastening plate, disposed on the lower fastening base in a covering manner, in which a back end of the upper fastening plate has at least one pivoting portion pivotally connected to the pivoting plate, a limiting portion, extending backward from the upper fastening plate and penetrating the limiting groove correspondingly, at least one stop block, convexly extending from the limiting portion and located behind the pivoting plate, and a fixing part, disposed on a frond end of the lower fastening base and used for fixing the upper fastening plate to the lower fastening base.

8 Claims, 5 Drawing Sheets

U.S. PATENT DOCUMENTS

| | | | |
|---|---|---|---|
| 8,292,649 B2 * | 10/2012 | Yeh | 439/331 |
| 2007/0077789 A1 * | 4/2007 | Ju et al. | 439/71 |
| 2008/0124955 A1 * | 5/2008 | Szu | 439/78 |
| 2010/0130048 A1 * | 5/2010 | Fan | 439/331 |
| 2011/0294330 A1 * | 12/2011 | Dai | 439/331 |

* cited by examiner

FASTENER FOR AN ELECTRICAL CONNECTOR

CROSS-REFERENCE TO RELATED APPLICATION

This non-provisional application claims priority under 35 U.S.C. §119(a) on Patent Application No. 201120122663.2 filed in P.R. China on Apr. 22, 2011, the entire contents of which are hereby incorporated by reference.

FIELD OF THE INVENTION

The present invention relates to a fastener, and more particularly to a fastener for fixing a chip module.

BACKGROUND OF THE INVENTION

A fastener is widely used for positioning a chip module in an electrical connector, so as to provide an applied force for implementing electrical conduction between the chip module and a circuit board disposed below the electrical connector through the electrical connector. As the development of the technologies puts increasingly higher requirements on the performance of the chip module, different chip modules need to be coordinated with different electrical connectors, so that conductive terminals on the electrical connector are distributed increasingly more densely. Therefore, a fastener structure needs to provide enough pressure for the electrical connector, so as to ensure stable and good electrical conduction between the chip module and the circuit board.

A common fastener existing in the industry includes: a lower fastening base, in which a pivoting part is disposed on one end of the lower fastening base, an upper fastening plate, disposed on the lower fastening base in a covering manner and having a butting part, in which the butting part is pivotally connected to the pivoting part correspondingly, so that the upper fastening plate is pivotally rotated around the pivoting part and covers the lower fastening base in a downward direction, a fixing part, used for pressing the upper fastening plate to be fixed on the lower fastening base.

In the prior art, when the fixing part is operated and a downward applied force is applied to the upper fastening plate to fix the upper fastening plate to the lower fastening base, the end where the butting part is located is already pivotally connected to the pivoting part through the butting part, so that the upper fastening plate can be pivotally rotated around the pivoting part and cover the lower fastening base in a downward direction. In this manner, if non-uniform force is applied to a relative free end of the upper fastening plate, a horizontal applied force is generated, so that the upper fastening plate is laterally deviated with respect to the lower fastening base.

Therefore, a heretofore unaddressed need exists in the art to address the aforementioned deficiencies and inadequacies.

SUMMARY OF THE INVENTION

In one aspect, the present invention is directed to a fastener capable of preventing an upper fastening plate from swinging with respect to a lower fastening base.

In one embodiment of the present invention, a fastener is provided. The fastener includes: a lower fastening base, in which a pivoting plate is disposed upward on a back end of the lower fastening base and concavely disposed with a limiting groove, an upper fastening plate, disposed on the lower fastening base in a covering manner, in which a back end of the upper fastening plate has at least one pivoting portion pivotally connected to the pivoting plate, a limiting portion, extending backward from the upper fastening plate and penetrating the limiting groove correspondingly, at least one stop block, convexly extending from the limiting portion and located behind the pivoting plate, and a fixing part, disposed on a frond end of the lower fastening base and used for fixing the upper fastening plate to the lower fastening base.

Compared with the prior art, in one aspect of the present invention, the fastener has the following advantages. The limiting portion extends backward at the upper fastening plate and enters and penetrates the limiting groove, so the limiting groove can limit and hold the limiting portion when the upper fastening plate is rotated, so as to prevent the upper fastening plate from swinging left and right with respect to the lower fastening base. The stop block convexly extends from the limiting portion and is located behind the pivoting plate, so when the upper fastening plate covers the lower fastening base, the stop block can lean against the pivoting plate, so as to prevent the upper fastening plate from being displaced forward excessively. Since forward and backward displacement travel of the upper fastening plate is limited, a left-and-right swinging amplitude of the upper fastening plate relative to the lower fastening base is reduced.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

Figure 1:
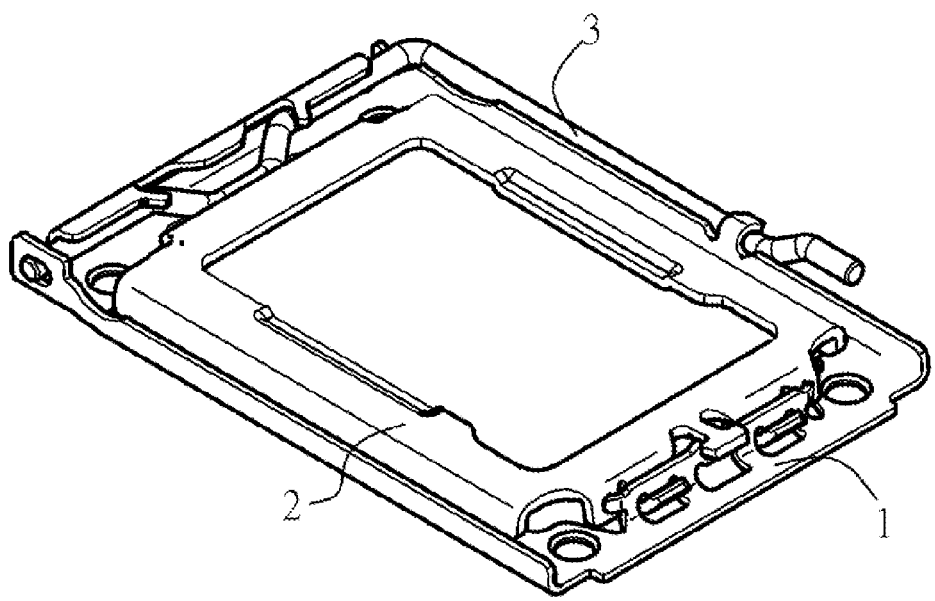
FIG. 1 is a three dimensional view of a fastener according to one embodiment of the present invention.

| List of Reference Numerals in FIGS. 1-5: | | | | | |
|---|---|---|---|---|---|
| Lower fastening base | 1 | Pivoting plate | 11 | Pivoting hole | 12 |
| Limiting groove | 13 | First bump | 14 | Second bump | 15 |
| First stop portion | 16 | Second stop portion | 17 | Bent plate | 18 |
| Bent portion | 19 | Hollow hole | 100 | Abdication hole | 101 |
| Latching portion | 102 | Front wall | 110 | Back wall | 111 |
| Upper top surface | 112 | Upper fastening plate | 2 | Pivoting portion | 20 |
| Limiting portion | 21 | First stop block | 22 | Second stop block | 23 |
| Fixing part | 3 | Pivoting arm | 30 | Operating arm | 31 |
| Pressing portion | 32 | Hook portion | 190 | | |

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

FIG. 1 shows a fastener according to one embodiment of the present invention, which is made of metal and includes a lower fastening base 1, an upper fastening plate 2 and a fixing part 3. The upper fastening plate 2 is disposed on the lower fastening base 1 in a covering manner. The fixing part 3 is pivotally engaged with the lower fastening base 1 and used for fixing the upper fastening plate 2 to the lower fastening base 1.

Figure 2:
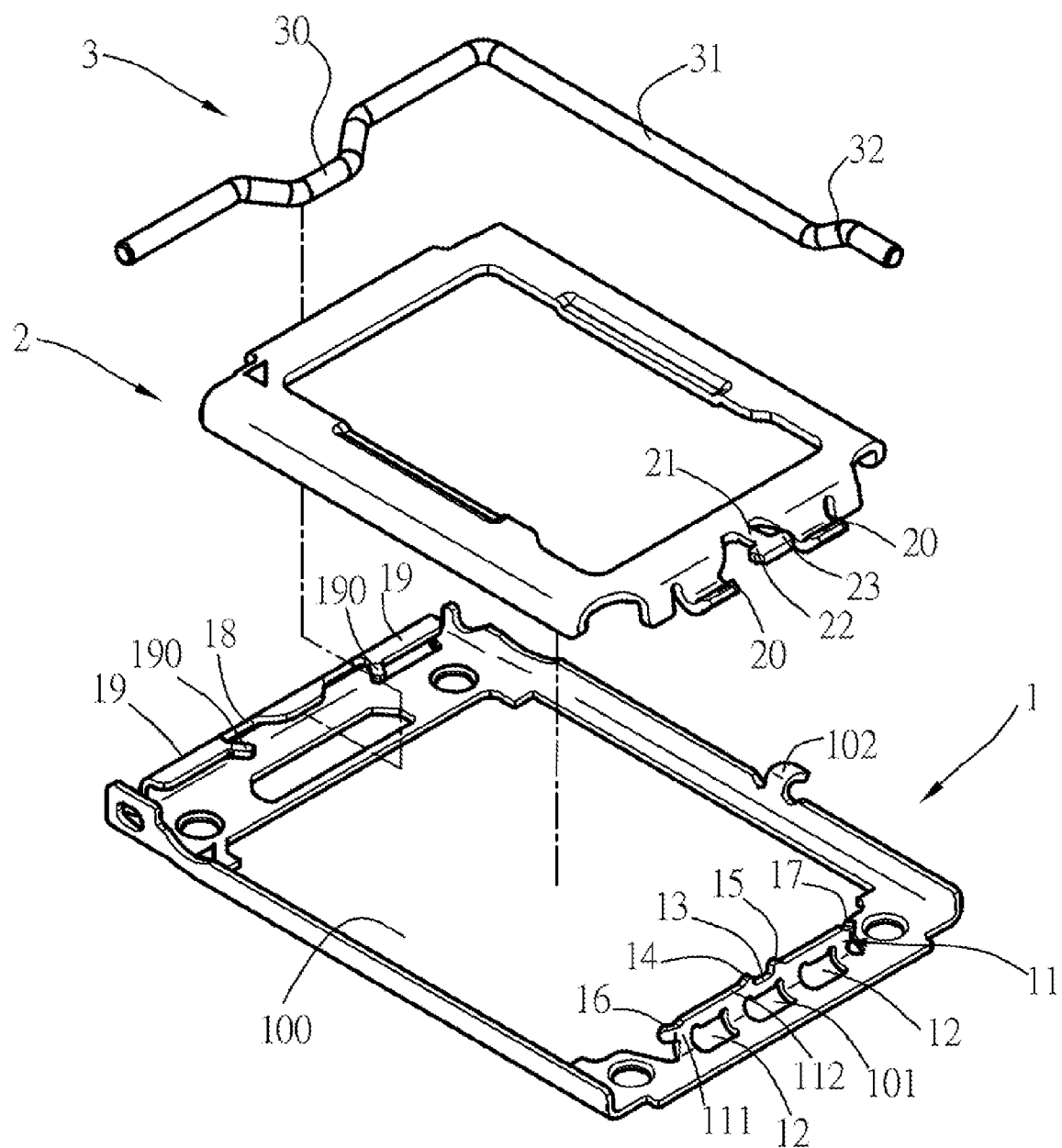
FIG. 2 is an exploded view of the fastener according to one embodiment of the present invention.
Figure 3:
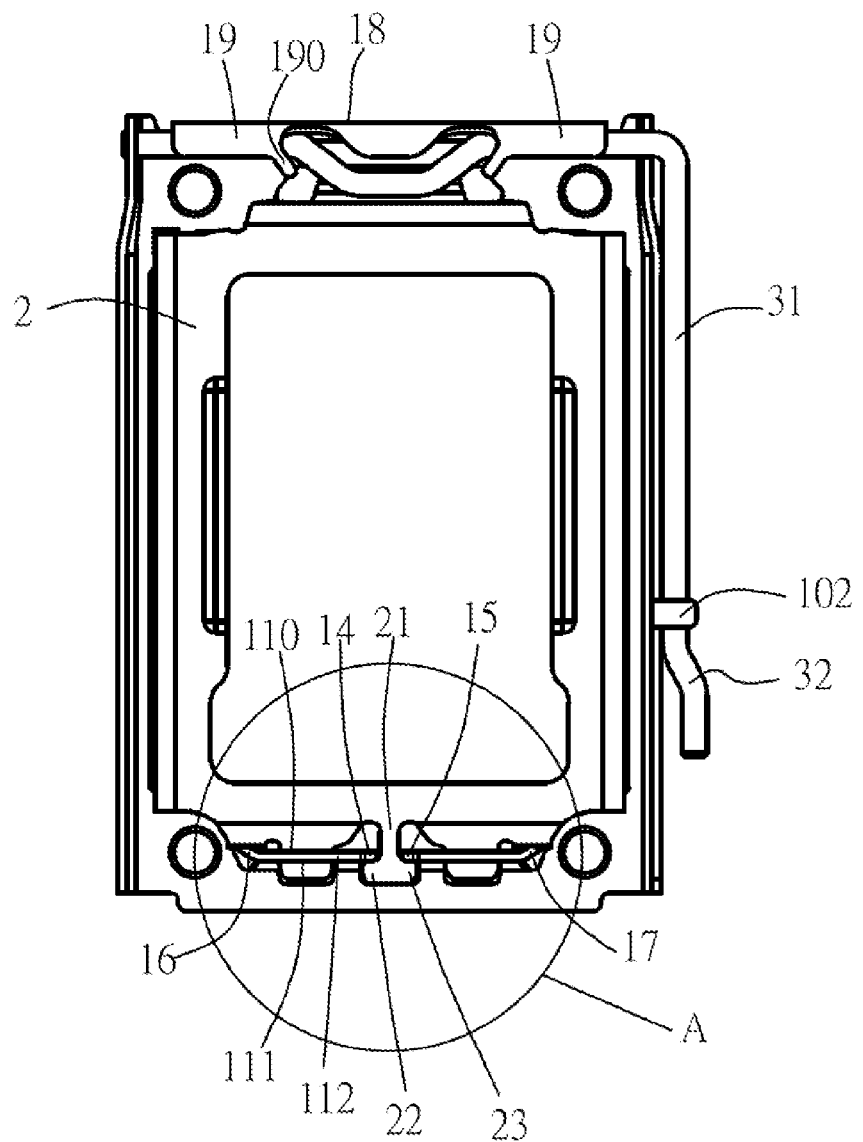
FIG. 3 is a top view of the fastener according to one embodiment of the present invention.

Referring to FIG. 2 and FIG. 3, the lower fastening base 1 is approximately frame-shaped and hollow-shaped, and disposed with a hollow hole 100 on a middle position thereof. A pivoting plate 11 is convexly disposed upward on a back end of the lower fastening base 1 and bent upward from an edge of the hollow hole 100 of the lower fastening base 1.

The pivoting plate 11 has a front wall 110, a back wall 111 and an upper top surface 112 and is disposed with two pivoting holes 12, in which the two pivoting holes 12 are symmetrical with respect to a forward and backward center line of the pivoting plate 11 and run from the front wall 110 through the back wall 111. A limiting groove 13 is concavely disposed on a middle position of the pivoting plate 11, penetrates from the front wall 110 to the back wall 111, and connects with the upper top surface 112. A bump is convexly disposed upward on a position of the pivoting plate 11 near the limiting groove 13. In the preferred embodiment, a first bump 14 and a second bump 15 are convexly disposed on the position of the pivoting plate 11 near the limiting groove 13 and located at two sides of the limiting groove 13. Similarly, the first bump 14 and the second bump 15 are symmetrical with respect to the forward and backward center line of the pivoting plate 11. Two side ends of the pivoting plate 11 are bent and extend towards the upper fastening plate 2 respectively to form a first stop portion 16 and a second stop portion 17 protruding forward. Free ends of the first stop portion 16 and the second stop portion 17 are curved surfaces and lean against a wall surface of a back end of the upper fastening plate 2, and the first stop portion 16 and the second stop portion 17 are symmetrical with respect to the forward and backward center line of the pivoting plate 11.

An abdication hole 101 is disposed on the back end of the lower fastening base 1 in a punching manner and located below the limiting groove 13 correspondingly. The front end of the lower fastening base 1 is bent upward to form a bent plate 18. A top end of the bent plate 18 is bent backward to form two bent portions 19. Hook portions 190 extend downward from free ends of the two bent portions 19 respectively. The fixing part 3 enters the two bent portions 19 and is hooked by the two hook portions 190 for being positioned. A latching portion 102 is convexly disposed outward on one side of the lower fastening base 1.

Figure 4:
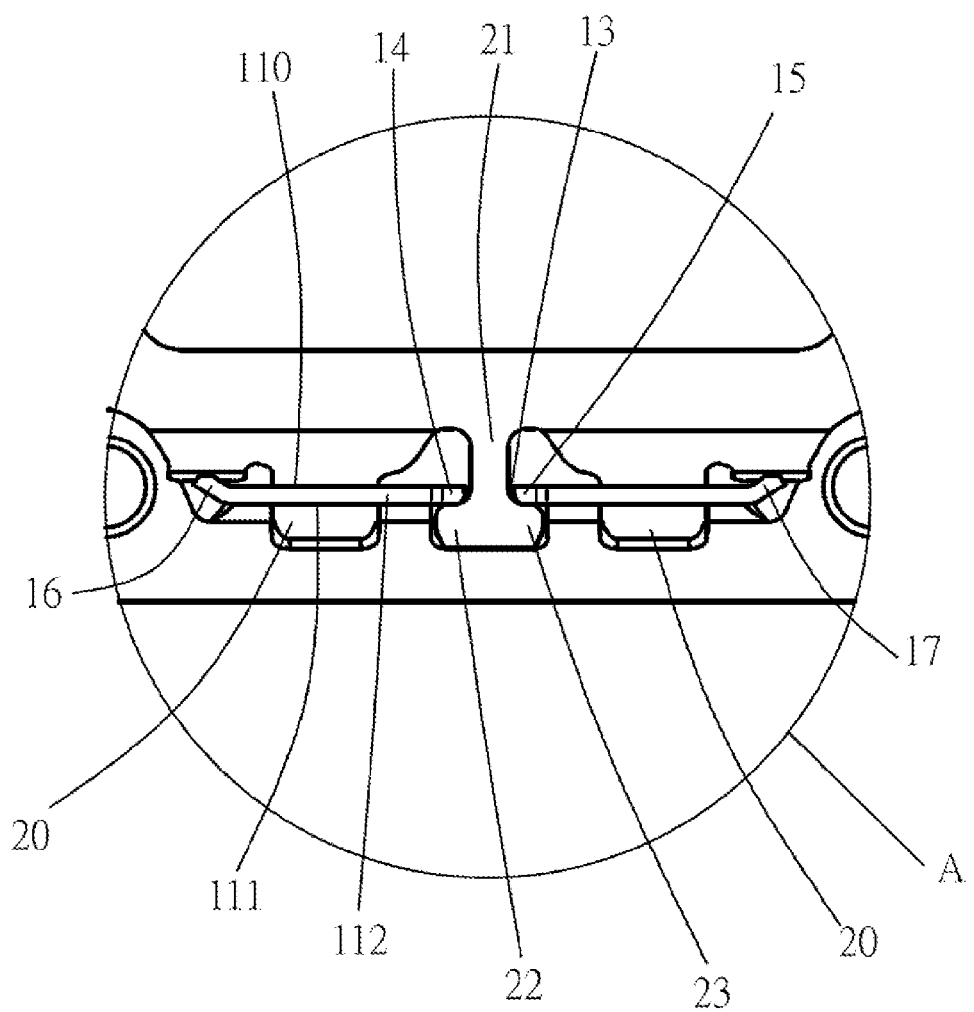
FIG. 4 is a schematic enlarged view of Part A in FIG. 3.

Referring to FIGS. 2-4, the upper fastening plate 2 is approximately frame-shaped and hollow-shaped, and disposed on the lower fastening base 1 in the covering manner. Two pivoting portions 20 extend backward from the back end of the upper fastening plate 2, and each of the two pivoting portions 20 enters each pivoting hole 12 correspondingly to form pivotal rotating connection, so that the upper fastening plate 2 can be pivotally rotated around the pivoting hole 12 and cover the lower fastening base 1 in a downward direction. A limiting portion 21 also extends from the back end of the upper fastening plate 2, enters and penetrates the limiting groove 13, the limiting portion 21 is an elongated plate shape, is formed after extending backward from the back end of the upper fastening plate 2, and is located between the two pivoting portions 20. Corresponding to the bump, a stop block convexly extends from the limiting portion 21 and is located behind the pivoting plate 11. In the preferred embodiment, a first stop block 22 extends at one side of the limiting portion 21, a second stop block 23 extends at the other side of the limiting portion 21, and the first stop block 22, the second stop block 23 and the limiting portion 21 are integrally formed. The first stop block 22 and the second stop block 23 are located behind the pivoting plate 11 and lean against the first bump 14 and the second bump 15.

Referring to FIG. 2 and FIG. 3, the fixing part 3 is used for pressing the upper fastening plate 2 to be fixed on the lower fastening base 1. The fixing part 3 includes: a pivoting arm 30, pivotally connected to the two bent portions 19, and an operation arm 31, being bent and extending backward from the pivoting arm 30. An end of the operation arm 31 is bent to form a pressing portion 32. The pressing portion 32 is latched to the latching portion 102, so that the upper fastening plate 2 can be fixed to the lower fastening base 1.

Figure 5:
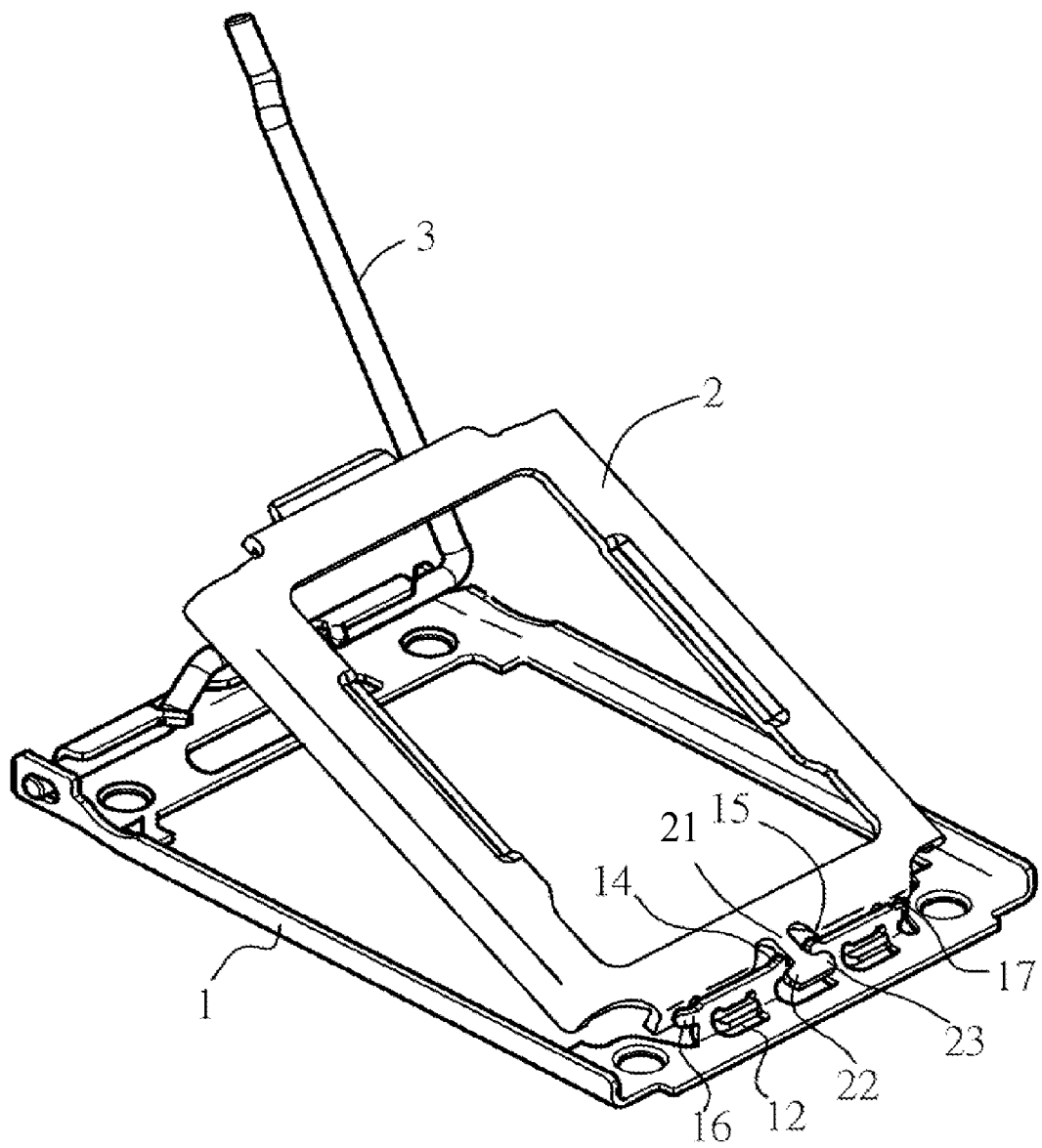
FIG. 5 is a schematic view in which an upper fastening plate of the fastener according to one embodiment of the present invention is opened to a certain angle.

Referring to FIG. 5, when the upper fastening plate 2 covers the lower fastening base 1 in a forward direction, the two pivoting portions 20 are rotated in the two pivoting holes 12, and the upper fastening plate 2 has a trend of sliding forward. In this case, the limiting portion 21 is located in the limiting groove 13, so two side walls of the limiting groove 13 can stop the limiting portion 21 from swinging left and right. The first stop block 22 and the second stop block 23 are somewhat displaced forward at two sides of the limiting portion 21 respectively to lean against the first bump 14 and the second bump 15. The upper fastening plate 2 is not displaced forward excessively due to a leaning effect of the first bump 14 and the second bump 15. When the upper fastening plate 2 has a trend of swinging to the left, the second stop block 23 located at a right side of the limiting portion 21 leans against the second bump 15, so as to prevent the upper fastening plate 2 from continuing swinging to the left. In contrast, when the upper fastening plate 2 has a trend of swinging to the right, the first stop block 22 located at a left side of the limiting portion 21 leans against the first bump 14, so as to prevent the upper fastening plate 2 from continuing swinging to the right.

When the upper fastening plate 2 is opened backward, the two pivoting portions 20 are rotated in the two pivoting holes 12. In this process, the wall surface of the back end of the upper fastening plate 2 has a trend of sliding backward. At this time, the two stop portions lean against the wall surface of the back end of the upper fastening plate 2, so as to stop the upper fastening plate 2 from being displaced excessively. When the upper fastening plate 2 has the trend of swinging to the left, the first stop portion 16 located at the left side of the limiting portion 21 leans against the wall surface of the back end of the upper fastening plate 2, so as to prevent the upper fastening plate 2 from continuing swinging to the left. In contrast, when the upper fastening plate 2 has the trend of swinging to the right, the second stop portion 17 located at the right side of the limiting portion 21 leans against the wall surface of the back end of the upper fastening plate 2, so as to prevent the upper fastening plate 2 from continuing swinging to the right. When the upper fastening plate 2 is opened completely, an end of the limiting portion 21, the first stop block 22 and the second stop block 23 enter the abdication hole 101.

Through the cooperation of the first stop block 22, the second stop block 23, the first stop portion 16 and the second stop portion 17, forward and backward displacement travel of the upper fastening plate 2 is limited when the upper fastening plate 2 is rotated around the pivoting plate 11, so as to prevent the upper fastening plate 2 from swinging left and right.

Compared with the prior art, the present invention, among other things, has the following benefit effects:

1. The limiting portion 21 extends backward at the upper fastening plate 2 and enters and penetrates the limiting groove 13, so the limiting groove 13 can limit and hold the limiting portion 21 when the upper fastening plate 2 is rotated, so as to prevent the upper fastening plate 2 from swinging left and right with respect to the lower fastening base 1.

2. The first stop block 22 and the second stop block 23 convexly extend from the limiting portion 21 and are located behind the pivoting plate 11, so when the upper fastening plate 2 covers the lower fastening base 1, the first stop block 22 and the second stop block 23 can lean against the pivoting plate 11, so as to prevent the upper fastening plate 2 from being displaced excessively, thereby reducing a left-and-right swinging amplitude of the upper fastening plate 2 relative to the lower fastening base 1.

3. The first stop portion 16 and the second stop portion 17 convexly extend towards the upper fastening plate 2, so when the upper fastening plate 2 is opened, the first stop portion 16 and the second stop portion 17 can lean against the upper fastening plate 2, so as to prevent the upper fastening plate 2 from being displaced backward excessively, thereby similarly reducing the left-and-right swinging amplitude of the upper fastening plate 2 relative to the lower fastening base 1.

4. Through the cooperation of the first stop block 22, the second stop block 23, the first stop portion 16 and the second stop portion 17, the forward and backward displacement travel of the upper fastening plate 2 is limited when the upper fastening plate 2 is rotated around the pivoting plate 11, so as to prevent the upper fastening plate 2 from swinging left and right.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A fastener for an electrical connector, comprising:
a lower fastening base, wherein a pivoting plate is disposed upward on a back end of the lower fastening base and concavely disposed with a limiting groove;
an upper fastening plate, disposed on the lower fastening base in a covering manner, wherein a back end of the upper fastening plate has at least one pivoting portion pivotally connected to the pivoting plate;
a limiting portion, extending backward from the upper fastening plate and running through the limiting groove correspondingly;
at least one stop block, convexly extending from the limiting portion and located behind the pivoting plate; and
a fixing part, pivotally fixed to the lower fastening base and used for fixing the upper fastening plate to the lower fastening base,
wherein an abdication hole is disposed on the lower fastening base corresponding to the limiting portion, and when the upper fastening plate is rotated and opened, an end of the limiting portion and the stop block both enter the abdication hole.

2. The fastener for an electrical connector according to claim 1, wherein the stop block leans against the pivoting plate.

3. The fastener for an electrical connector according to claim 1, wherein two stop blocks extends at two sides of the limiting portion respectively.

4. The fastener for an electrical connector according to claim 1, wherein the stop block and the limiting portion are integrally formed.

5. The fastener for an electrical connector according to claim 1, wherein at least one bump is convexly disposed upward on a position of the pivoting plate near the limiting portion and is located in front of the stop block correspondingly.

6. The fastener for an electrical connector according to claim 1, wherein the limiting groove is located on a middle position of the pivoting plate, and the limiting portion is located on a middle position of the back end of the upper fastening plate correspondingly.

7. The fastener for an electrical connector according to claim 1, wherein two stop portions are convexly disposed towards the upper fastening plate on two side ends of the pivoting plate and leans against the upper fastening plate.

8. The fastener for an electrical connector according to claim 1, wherein two stop portions are bent from the two side ends of the pivoting plate and extend towards the upper fastening plate.

* * * * *